United States Patent
Koshihara et al.

(10) Patent No.: US 9,985,241 B2
(45) Date of Patent: May 29, 2018

(54) ELECTRO-OPTICAL APPARATUS AND ELECTRONIC DEVICE

(71) Applicant: SEIKO EPSON CORPORATION, Tokyo (JP)

(72) Inventors: Takeshi Koshihara, Matsumoto (JP); Yuki Hanamura, Azumino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days. days.

(21) Appl. No.: 15/427,634

(22) Filed: Feb. 8, 2017

(65) Prior Publication Data

US 2017/0237033 A1 Aug. 17, 2017

(30) Foreign Application Priority Data

Feb. 15, 2016 (JP) .................................. 2016-026212

(51) Int. Cl.
| H01L 33/00 | (2010.01) |
| H01L 51/52 | (2006.01) |
| H01L 27/32 | (2006.01) |

(52) U.S. Cl.
CPC .......... H01L 51/524 (2013.01); H01L 27/322 (2013.01); H01L 27/3276 (2013.01)

(58) Field of Classification Search
CPC . H01L 27/3276; H01L 27/322; H01L 51/524; H01L 51/5012
USPC ........................................ 257/40, 59, 72, 88
See application file for complete search history.

(56) References Cited

U.S. PATENT DOCUMENTS

| 9,076,990 B2* | 7/2015 | Nakamura | ............ H01L 27/322 |
| 2004/0061434 A1 | 4/2004 | Mori et al. | |
| 2014/0117334 A1 | 5/2014 | Nakamura et al. | |
| 2014/0361273 A1 | 12/2014 | Nozawa | |
| 2014/0367661 A1* | 12/2014 | Akagawa | ............ H01L 51/5256 257/40 |
| 2015/0287959 A1 | 10/2015 | Hanamura | |
| 2016/0190504 A1 | 6/2016 | Koshihara | |
| 2016/0190520 A1 | 6/2016 | Koshihara | |

FOREIGN PATENT DOCUMENTS

| JP | 2006-066364 A | 3/2006 |
| JP | 2006-134825 A | 5/2006 |
| JP | 2006-185593 A | 7/2006 |
| JP | 2007-073353 A | 3/2007 |
| JP | 2007-234610 A | 9/2007 |
| JP | 2014-089803 A | 5/2014 |
| JP | 2014-235958 A | 12/2014 |
| JP | 2015-207551 A | 11/2015 |

(Continued)

*Primary Examiner* — Thien F Tran
(74) *Attorney, Agent, or Firm* — Oliff PLC

(57) ABSTRACT

An electro-optical apparatus includes an element substrate which includes a display region in which a plurality of light emitting elements are arranged in a matrix form, and a terminal region in which mounting terminals are arranged outside the display region; a sealing film which seals the plurality of light emitting elements; and a sealing substrate which is arranged on the element substrate via the sealing film, in which a distance between the sealing substrate and the mounting terminal is equal to or longer than a thickness dimension of the sealing substrate when seen from a surface normal direction of the element substrate.

8 Claims, 11 Drawing Sheets

(56) References Cited

FOREIGN PATENT DOCUMENTS

| | | |
|---|---|---|
| JP | 2016-122138 A | 7/2016 |
| JP | 2016-122612 A | 7/2016 |
| JP | 2016-122614 A | 7/2016 |

* cited by examiner

ELECTRO-OPTICAL APPARATUS AND ELECTRONIC DEVICE

BACKGROUND

1. Technical Field

The present invention relates to an electro-optical apparatus and an electronic device.

2. Related Art

As an example of an electro-optical apparatus, there is proposed an organic electroluminescent (EL) apparatus in which pixels using an organic EL element are arranged in a matrix form in a display region of an element substrate (for example, JP-A-2007-234610).

Specifically, in JP-A-2007-234610, the organic EL element is configured with an anode, an insulating film, an organic layer, and a cathode which also function as a reflecting layer and which are laminated in sequence from a side of a substrate for driving, and is sealed by a protective film provided in the display region.

In JP-A-2007-234610, after forming the protective film on the organic EL element, the protective film is formed in the display region and an external connecting region (a region other than the display region of the element substrate) of the element substrate, the protective film is anisotropically etched while using a sealing substrate as a mask, and thus the protective film on the external connecting region is removed.

Meanwhile, the sealing substrate is a mask having a thickness of about 1 mm as different from a generally used photolithography mask, and there is a problem that the protective film which has a film thickness of several tens of μm in the vicinity of the sealing substrate which becomes the mask, is not sufficiently etched.

SUMMARY

An advantage of some aspects of the invention is to provide an electro-optical apparatus and an electronic device in which a protective film can be sufficiently etched while using a sealing substrate as a mask.

According to an aspect of the invention, there is provided an electro-optical apparatus including an element substrate which includes a display region in which a plurality of light emitting elements are arranged in a matrix form, and a terminal region in which mounting terminals are arranged outside the display region; a sealing film which seals the plurality of light emitting elements; and a sealing substrate which is arranged on the element substrate via the sealing film, in which a distance between the sealing substrate and the mounting terminal is equal to or longer than a thickness dimension of the sealing substrate when seen from a surface normal direction of the element substrate.

In this case, because the sealing substrate and the mounting terminal are separated from each other by a distance which is equal to or longer than the thickness dimension of the sealing substrate, when etching the sealing film while using the sealing substrate as a mask, the sealing film covering the mounting terminals can be sufficiently removed by etching in a manufacturing process.

In the electro-optical apparatus, a distance between one side of the element substrate where the mounting terminals are arranged and the mounting terminal may be equal to or longer than the half of the thickness dimension of the sealing substrate.

In this case, even in a case of manufacturing a plurality of the electro-optical apparatuses at the same time by using a mother substrate, the sealing film covering the mounting terminals can be sufficiently removed by etching.

In the electro-optical apparatus, the light emitting element may include an anode, a cathode, and a light emitting layer which is interposed between the anode and the cathode, the cathode may cover a data line driving circuit provided in the terminal region, and the sealing substrate may cover a part of the cathode.

In this case, heat of the data line driving circuit can be dissipated through a part of the cathode exposed from the sealing film. Accordingly, the electro-optical apparatus can be operated at an appropriate temperature.

According to another aspect of the invention, there is provided an electronic device including the electro-optical apparatus described above.

In this case, because the electronic device includes the electro-optical apparatus manufactured by etching using the sealing substrate, the electronic device having excellent display quality and high productivity can be obtained.

According to still another aspect of the invention, there is provided a method for manufacturing an electro-optical apparatus, the method including forming a plurality of light emitting elements and a plurality of mounting terminals on an element substrate; forming a sealing film so as to cover the plurality of light emitting elements and the plurality of mounting terminals; arranging a sealing substrate on the element substrate via the sealing film; and etching the sealing film so as to expose at least a part of the mounting terminals while using the sealing substrate as a mask, in which in the forming of the plurality of mounting terminals, the mounting terminals are formed such that a distance between the sealing substrate and the mounting terminal is equal to or longer than a thickness dimension of the sealing substrate when seen from a surface normal direction of the element substrate.

In the method for manufacturing an electro-optical apparatus, in the forming of the plurality of mounting terminals, the mounting terminals are formed such that a distance between one side of the element substrate where the plurality of mounting terminals are arranged and the mounting terminal is equal to or longer than the half of the thickness dimension of the sealing substrate when seen from the surface normal direction of the element substrate.

In the method for manufacturing an electro-optical apparatus, in the forming of the mounting terminals, the mounting terminals are formed such that in a case of using a mother substrate, and in a case where a display region of each of element substrate forming regions is present in a horizontal direction, and where a terminal region of each of the element substrate forming regions is present in a vertical direction when seen from a surface normal direction of the mother substrate, a distance between scribe lines between the mounting terminal of one element substrate forming region, and the other element substrate forming region, the element substrate forming regions being adjacent to each other in the vertical direction, is equal to or longer than the half of the thickness dimension of the sealing substrate.

In the method for manufacturing an electro-optical apparatus, in the forming of the light emitting elements, a cathode is formed so as to cover a data line driving circuit provided in the terminal region, and in the etching of the sealing film, a part of the cathode is exposed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Below, description will be given of embodiments which embody the invention with reference to the diagrams. Here, the diagrams to be used are presented after being appropriately enlarged or reduced such that it is possible to clearly recognize portions to be described and promote understanding of a reader.

In addition, in the following description of the embodiments, for example, a case where "on a substrate" is described includes a case of being arranged so as to come into contact with a substrate, a case of being arranged on a substrate via another component, or a case where a part is arranged so as to come into contact with a substrate and a part is arranged via another component.

First Embodiment

Organic EL Apparatus

Description will be given of an organic EL apparatus in the present embodiment.

Figure 1:
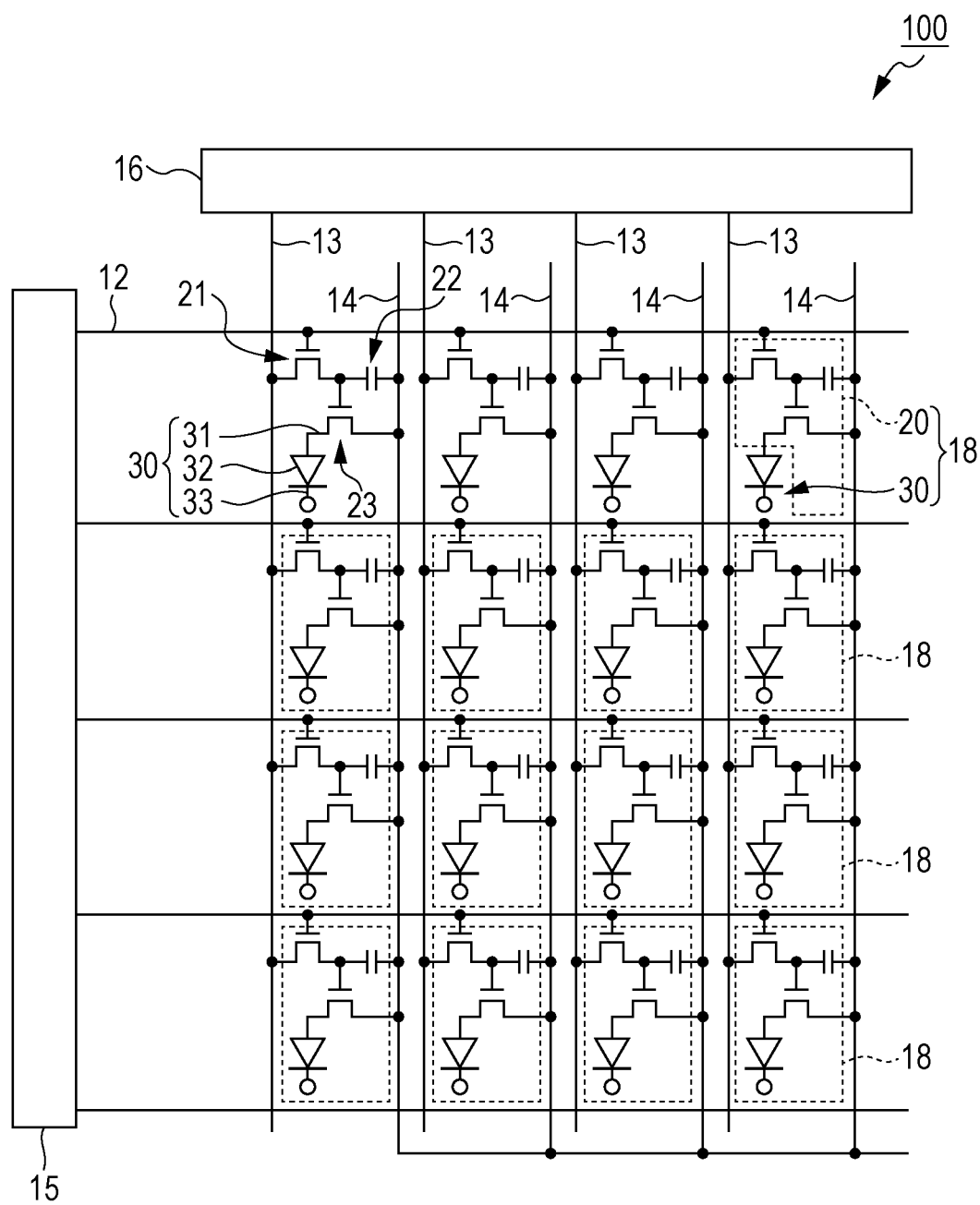
FIG. 1 is an equivalent circuit diagram which shows an electrical configuration of an organic EL apparatus according to a first embodiment.

FIG. 1 is an equivalent circuit diagram which shows an electrical configuration of an organic EL apparatus according to the first embodiment.

Figure 2A:
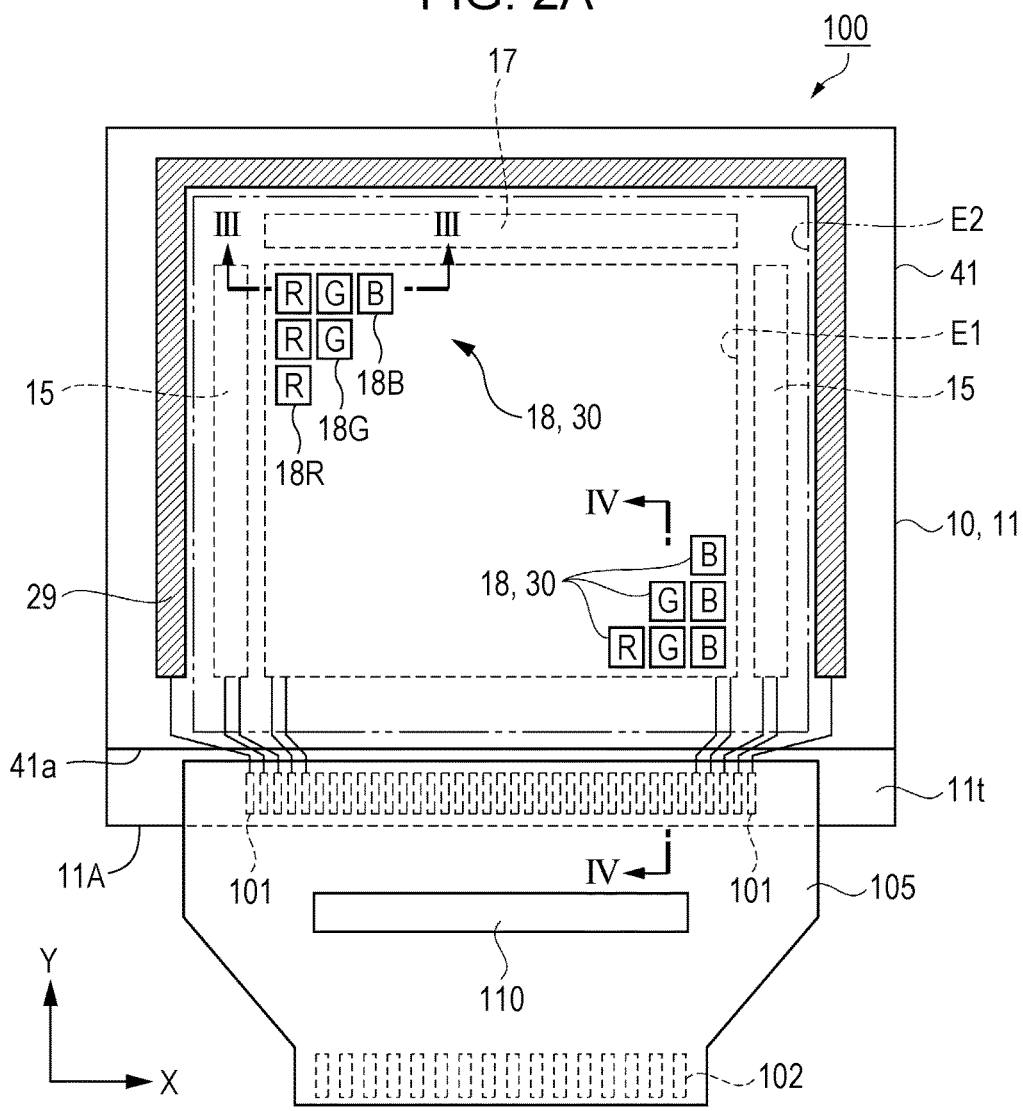
FIG. 2A is a schematic planar diagram which shows a configuration of the organic EL apparatus according to the first embodiment.
Figure 2B:
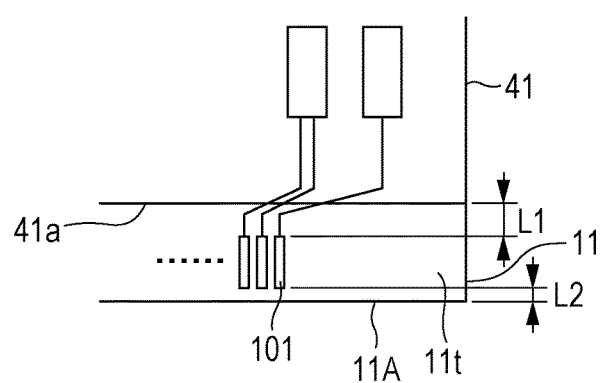
FIG. 2B is a partially enlarged diagram of FIG. 2A.

FIG. 2A is a schematic planar diagram which shows a configuration of an organic EL apparatus according to the first embodiment. FIG. 2B is a partially enlarged diagram of FIG. 2A. In FIGS. 2A and 2B, in order to facilitate understanding of the invention, in the drawings, there are cases where a dashed line is used when a solid line is to be used or a solid line is used when a dashed line is to be used.

As shown in FIG. 1, an organic EL apparatus (electro-optical apparatus) 100 according to the present embodiment has a plurality of scan lines 12, a plurality of data lines 13, and power lines 14 which intersect with each other. The plurality of the scan lines 12 are connected with a scan line driving circuit 15 and the plurality of the data lines 13 are connected with a data line driving circuit 16. A plurality of sub pixels 18 are arranged in a matrix form corresponding to each intersecting section between the plurality of the scan lines 12 and the plurality of the data lines 13.

The sub pixels 18 include an organic EL element (light emitting element) 30 which is a light emitting element and a pixel circuit 20 for controlling driving of the organic EL element 30.

The organic EL element 30 is configured of a pixel electrode (anode) 31 which functions as an anode, a common electrode 33 which functions as a cathode, a functional layer 32 which includes an organic light emitting layer which is a light emitting body which is provided between the pixel electrode 31 and the common electrode (cathode) 33. It is possible to describe the organic EL element 30 as an electrical diode.

The pixel circuit 20 has a switching transistor 21, a storage capacitor 22, and a driving transistor 23. It is possible to configure the switching transistor 21 and the driving transistor 23, for example, using an n-channel type or p-channel type thin film transistor (TFT) or a MOS transistor.

A gate of the switching transistor 21 is connected with the scan line 12, either of a source or a drain is connected with the data line 13, and the other of the source or the drain is connected with a gate of the driving transistor 23. Either of a source or a drain of the driving transistor 23 is connected with the pixel electrode 31 of the organic EL element 30 and the other of the source or the drain is connected with the power line 14. The storage capacitor 22 is connected between the gate of the driving transistor 23 and the power line 14.

When a control signal is supplied from the scan line driving circuit 15 to the switching transistor 21 via the scan line 12, a gate is set to an on state. Then, a potential based on an image signal which is supplied from the data line driving circuit 16 via the data line 13 is held in the storage capacitor 22 via the switching transistor 21. The on or off state of a gate of the driving transistor 23 is determined corresponding to the potential which is held in the storage capacitor 22, that is, the gate potential of the driving transistor 23. When the gate of the driving transistor 23 is in the on state, a current flows in the functional layer 32, which is interposed between the pixel electrode 31 and the common electrode 33, from the power line 14 via the driving transistor 23. The organic EL element 30 emits light according to the size of the current which flows in the functional layer 32.

Here, the configuration of the pixel circuit 20 is not limited thereto. For example, the pixel circuit 20 may be provided between the pixel electrode 31 and the driving transistor 23 and may be provided with a transistor for controlling light emission which controls conduction between the pixel electrode 31 and the driving transistor 23.

The organic EL apparatus 100 has an element substrate 10 and a sealing substrate 41 which is arranged to oppose the element substrate 10. A display region E1 (shown with a dashed line in the diagram) and a dummy region E2 (shown with a two-dot chain line in the diagram) outside the display region E1 are provided in the element substrate 10. Parts outside the dummy region E2 are a non-display region.

The sub pixels 18 are arranged in a matrix form in the display region E1. As described above, the sub pixel 18 is provided with the organic EL element 30 which is a light emitting element and emitted light of any color of red (R), green (G), and blue (B) is obtained along with the operation of the switching transistor 21 and the driving transistor 23. Here, a pixel which emits red light is a sub pixel 18R, a pixel which emits green light is a sub pixel 18G, and a pixel which emits blue light is a sub pixel 18B. Below, there are also cases where "the sub pixels 18" is used to represent all of the sub pixels 18R, 18G, and 18B.

In the present embodiment, the sub pixels 18 where emitted light of the same color is obtained are arranged in the vertical direction in the diagram and the sub pixels 18 where emitted light of different colors is obtained are arranged in the horizontal direction. This arrangement of the sub pixels 18 is referred to as a stripe system. Below, description will be given by setting a direction in which the sub pixels 18 where emitted light of different colors is obtained are arrayed as an X direction and setting a direction in which the sub pixels 18 where emitted light of the same color is obtained are arrayed as a Y direction.

Arrays of the sub pixels 18 in the X direction are set as R, G, and B in the diagram; however, without being limited thereto, it is possible to use a plurality of combinations. In addition, the arrays of the sub pixels 18 are not limited to the stripe system and may be a mosaic system or a delta system.

A peripheral circuit for causing the organic EL element 30 of each of the sub pixels 18 to emit light is provided mainly in the dummy region E2. For example, as shown in FIGS. 2A and 2B, a pair of the scan line driving circuits 15 is provided extending in the Y direction to a position which interposes the display region E1 in the X direction. An inspection circuit 17 is provided in a position along the display region E1 between a pair of the scan line driving circuits 15.

The element substrate 10 has a wiring layer 29 which is arranged to surround the dummy region E2 extending in the Y direction along a pair of the scan line driving circuits 15 and in the X direction along the inspection circuit 17. The common electrode 33 of the organic EL element 30 is formed as a common cathode over a plurality of the organic EL elements 30, that is, a plurality of the sub pixels 18. In addition, the common electrode 33 is formed to cover from the display region E1 to a non-display region and is electrically connected with the wiring layer 29 described above in the non-display region.

The element substrate 10 is larger than the sealing substrate 41 and a plurality of mounting terminals 101 for electrically connecting with an external driving circuit are arrayed in the X direction in one side section which protrudes from the sealing substrate 41 in the Y direction (in the diagram, a side section between an end section on the lower part of the element substrate 10 and the dummy region E2; referred to below as a terminal region 11t). A flexible circuit substrate (below, FPC) 105 is connected with the plurality of the mounting terminals 101. A driving IC 110 is mounted in the FPC 105.

The driving IC 110 includes the data line driving circuit 16 described above. The FPC 105 has an input terminal 102 which is connected with the input side of the driving IC 110 via wiring and an output terminal (which is not shown in the diagram) which is connected with the output side of the driving IC 110 via wiring.

The data line 13 or the power line 14 on the element substrate 10 side is electrically connected with the driving IC 110 via the mounting terminals 101 and the FPC 105. The wiring which is connected with the scan line driving circuit 15 or the inspection circuit 17 is electrically connected with the driving IC 110 via the mounting terminals 101 and the FPC 105. The common electrode 33 as a common cathode is also electrically connected with the driving IC 110 via the wiring layer 29, the mounting terminals 101, and the FPC 105.

Accordingly, a control signal, a potential for driving (VDD), or the like from the driving IC 110 is supplied to any of the plurality of the mounting terminals 101 which are arrayed in the terminal region 11t. That is, securing electrical connection reliability between the mounting terminals 101 and an output terminal on the FPC 105 side greatly contributes to the operation of the organic EL apparatus 100.

It is possible to use a method which is known in the art as a method for electrically connecting the plurality of the mounting terminals 101 on the element substrate 10 side and an output terminal on the FPC 105 side and examples thereof include a method in which a thermoplastic anisotropic conductive film or a thermosetting type anisotropic adhesive is used.

Structure of Organic EL Apparatus

Next, description will be given of the structure of the organic EL apparatus 100 with reference to FIG. 3 and FIG. 4.

Figure 3:
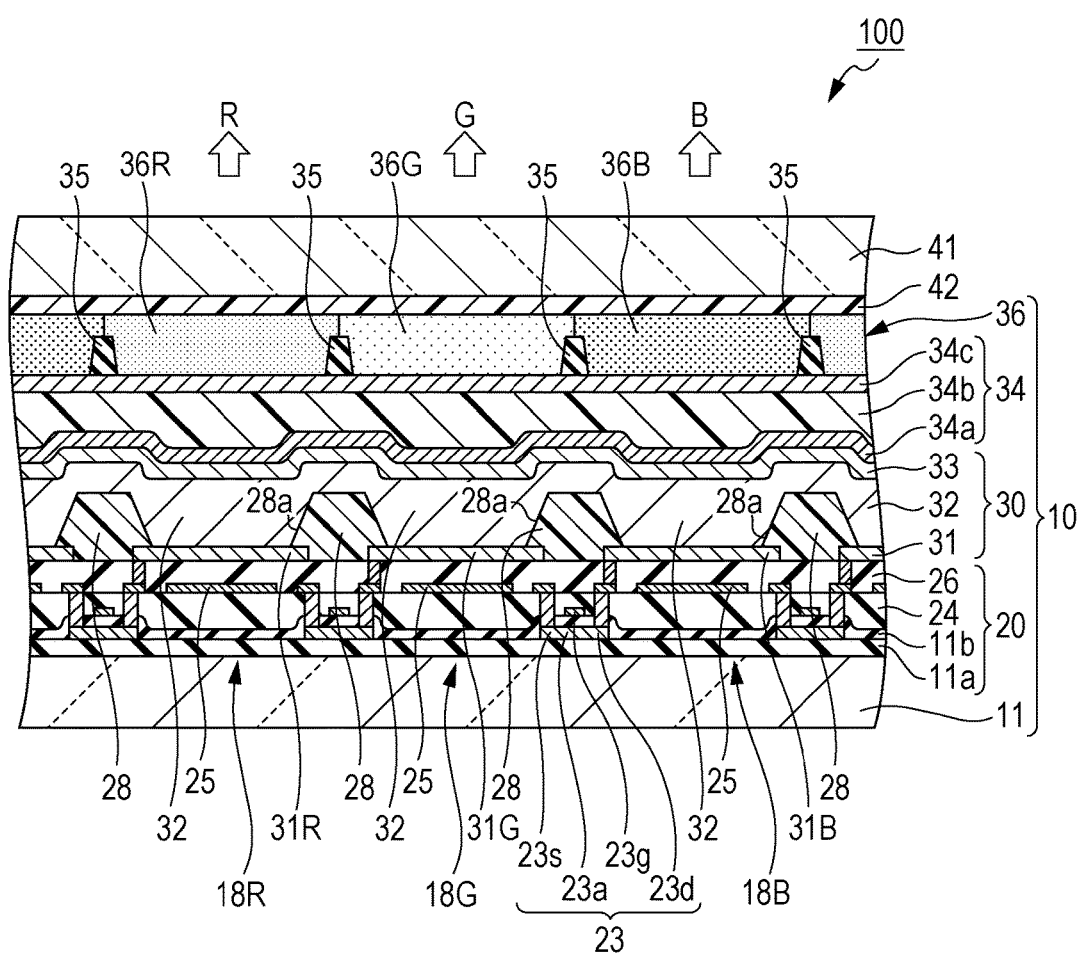
FIG. 3 is a schematic cross-sectional diagram which shows a structure of the organic EL apparatus taken along a line III-III in FIG. 2A.

FIG. 3 is a schematic cross-sectional diagram which shows the structure of the organic EL apparatus 100 along the line III-III in FIG. 2A. FIG. 4 is a schematic cross-sectional diagram which shows the structure of the organic EL apparatus 100 along the line IV-IV in FIG. 2A.

Figure 4:
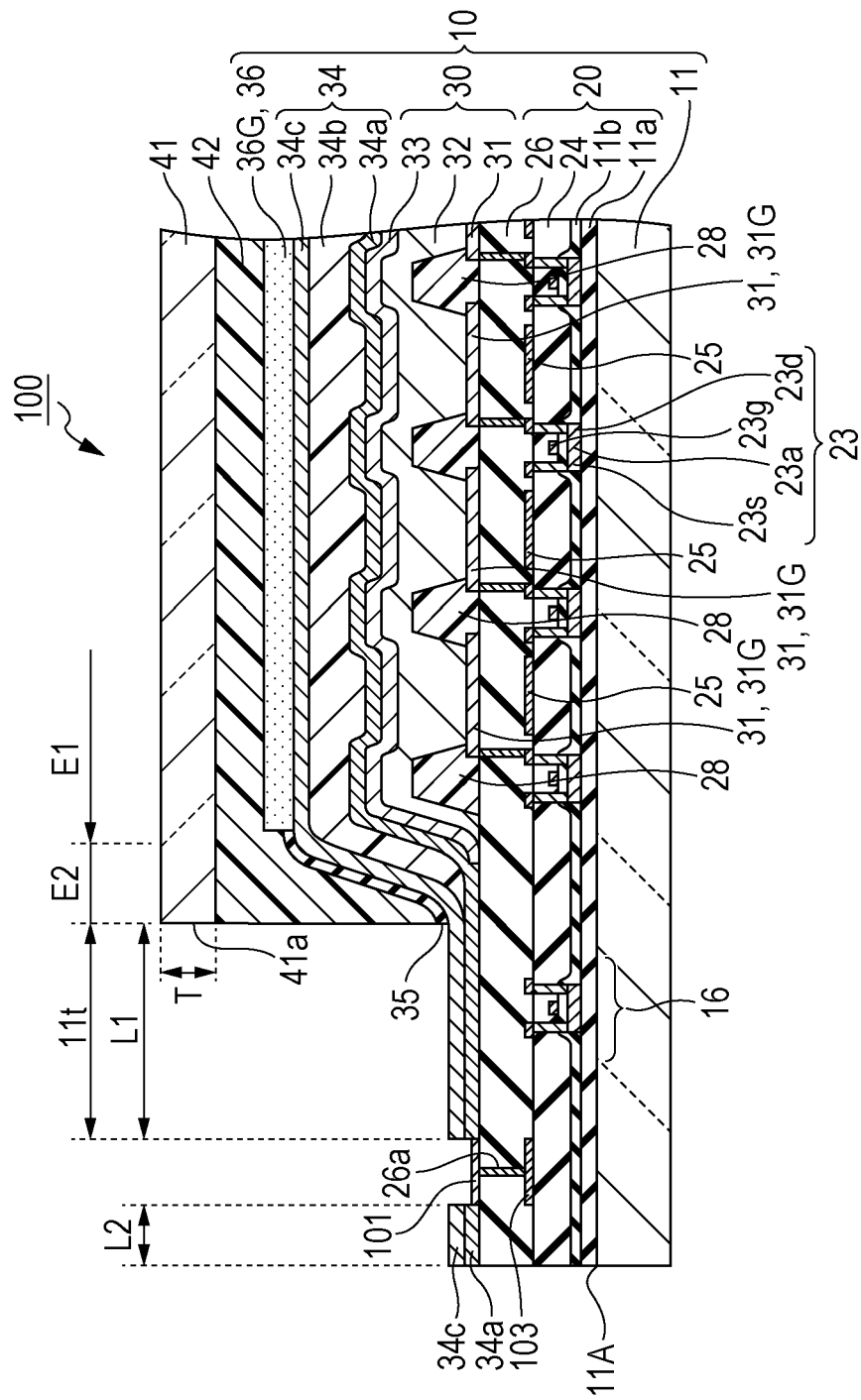
FIG. 4 is a schematic cross-sectional diagram which shows a structure of the organic EL apparatus taken along a line IV-IV in FIG. 2A.

FIG. 3 shows the structure of the sub pixels 18 in the display region E1 and FIG. 4 shows the structure of the terminal region 11t. Here, a base material 11 described below is equivalent to the element substrate in the invention.

As shown in FIG. 3, the organic EL apparatus 100 is provided with the element substrate 10 which includes the base material 11, in addition to the pixel circuit 20, the organic EL element 30, a sealing layer 34, which seals a plurality of the organic EL elements 30, and a color filter 36 which are formed in sequence on the base material 11. In addition, the sealing substrate 41 which is arranged to oppose with respect to the element substrate 10 is provided.

The sealing substrate 41 is formed of a transparent substrate with respect to a visible light region, for example, such as quartz glass and is arranged to oppose the element substrate 10 via a filler 42 in order to protect the color filter 36 which is formed on the sealing layer 34 in the element substrate 10.

Light emitted from the functional layer 32 of the sub pixels 18R, 18G, and 18B is reflected by a reflecting layer 25 which will be described below and is extracted from the sealing substrate 41 side after passing through the color filter 36. That is, the organic EL apparatus 100 is a top emission type light emitting apparatus.

Since the organic EL apparatus 100 is a top emission type, it is possible to use not only a transparent substrate such as quartz glass, but also an opaque substrate such as silicon (Si) or ceramics for the base material 11. Below, description will be given of an example of a case of using quartz glass as the base material 11 and using a thin film transistor as the pixel circuit 20.

A first insulating film 11a is formed covering the surface of the base material 11. For example, a semiconductor layer 23a of the driving transistor 23 in the pixel circuit 20 is formed on the first insulating film 11a. A second insulating film 11b which functions as a gate insulating film covering the semiconductor layer 23a is formed. A gate electrode 23g is formed in a position which opposes a channel region of the semiconductor layer 23a via the second insulating film 11b. A first interlayer insulating film 24 is formed with a film thickness of 300 nm to 2 μm covering the gate electrode 23g. A planarization process is carried out on the first interlayer insulating film 24 in order to remove unevenness on a surface which is generated by covering the driving transistor 23 of the pixel circuit 20 and the like.

Contact holes which pass through the second insulating film 11b and the first interlayer insulating film 24 are formed respectively corresponding to a source region 23s and a drain region 23d of the semiconductor layer 23a. A conductive film is formed so as to fill these contact holes and patterned to form an electrode or wiring which is connected with the driving transistor 23.

In addition, the conductive film described above has light reflection properties and for example, is formed using aluminum (Al), an alloy of aluminum (Al) and silver (Ag) or copper (Cu), or the like. By carrying out patterning thereon, the reflecting layer 25, which is independent, is formed for each sub pixel 18. In the present embodiment, the light reflectivity of the reflecting layer 25 is preferably 40% or more and more preferably 80% or more. Although not shown in FIG. 3, the switching transistor 21 or the storage capacitor 22 in the pixel circuit 20 is also formed on the base material 11.

A second interlayer insulating film 26 is formed with a film thickness of 10 nm to 2 μm covering the reflecting layer 25 and the first interlayer insulating film 24. In addition, a contact hole for electrically connecting the pixel electrode 31 and the driving transistor 23 later is formed to pass through the second interlayer insulating film 26. It is possible to use, for example, a silicon oxide, a silicon nitride, or a silicon oxynitride as the material which configures the first insulating film 11a, the second insulating film 11b, the first interlayer insulating film 24, and the second interlayer insulating film 26.

A conductive layer is formed covering the second interlayer insulating film 26 so as to fill the contact hole which is formed in the second interlayer insulating film 26. Pixel electrodes 31 (31R, 31G, and 31B) are formed by patterning the conductive film. The pixel electrodes 31 (31R, 31G, and 31B) are formed using a transparent conductive film of indium tin oxide (ITO), indium zinc oxide (IZO), or the like. In the present embodiment, the light transmittance of the pixel electrode 31 is preferably 50% or more and more preferably 80% or more. Here, in a case where the reflecting layer 25 is not provided for each sub pixel 18, the pixel electrodes 31 (31R, 31G, and 31B) may be formed using aluminum (Al) with light reflection properties or an alloy thereof.

A partition wall 28 is formed covering outer edge sections of each of the pixel electrodes 31R, 31G, and 31B. Due to this, an opening section 28a is formed in each of the pixel electrodes 31R, 31G, and 31B. The partition wall 28 is formed to respectively divide each of the pixel electrodes 31R, 31G, and 31B at a height of approximately 1 μm using, for example, an acryl-based photosensitive resin.

Here, in the present embodiment, the partition wall 28 formed with a photosensitive resin is formed in order to set a state where each of the pixel electrodes 31R, 31G, and 31B is insulated from each other; however, each of the pixel electrodes 31R, 31G, and 31B may be divided using an inorganic insulating material such as a silicon oxide.

The functional layer 32 is formed so as to come into contact with each of the pixel electrodes 31R, 31G, and 31B using a vapor deposition process such as a vacuum vapor deposition method and a surface of the partition wall 28 is also covered by the functional layer 32. Here, since the functional layer 32 may be formed in a region which is divided by the partition wall 28, the functional layer 32 may or may not cover all of the surface of the partition wall 28. Thus, a top section of the partition wall 28 may or may not be covered by the functional layer 32.

The functional layer 32 has, for example, a hole injection layer, a hole transportation layer, an organic light emitting layer, an electron transportation layer, and an electron injection layer. In the present embodiment, the functional layer 32 is formed by forming and laminating in sequence each of a hole injection layer, a hole transportation layer, an organic light emitting layer, an electron transportation layer, and an electron injection layer with respect to the pixel electrode 31 using a vapor deposition process.

Here, the layer configuration of the functional layer 32 is not limited thereto and an intermediate layer which controls movements of holes or electrons which are carriers may be further included and it is also possible to reduce the number of layers by, for example, the organic light emitting layer having a function of an electron transportation layer.

The organic light emitting layer may have a configuration which is able to obtain white emitted light and for example, it is possible to adopt a configuration where an organic light emitting layer where red emitted light is obtained, an organic light emitting layer where green emitted light is obtained, and an organic light emitting layer where blue emitted light is obtained are combined.

The common electrode 33 is formed as a common cathode covering the functional layer 32. The common electrode 33 is formed by forming, for example, an alloy of Mg and Ag with an approximate film thickness (for example, 10 nm to 30 nm) at which it is possible to obtain light transmitting properties and light reflection properties. In the present embodiment, the light transmittance of the common electrode 33 is preferably 20% or more and more preferably 30% or more, and the light reflectivity of the common electrode 33 is preferably 20% or more, and more preferably 50% or more. Due to this, a plurality of the organic EL elements 30 are completed.

An optical resonator may be configured between the reflecting layer 25 and the common electrode 33 for each of the sub pixels 18R, 18G, and 18B by forming the common electrode 33 in a state of having light transmitting properties and light reflection properties. The optical resonator extracts light with a specific resonant wavelength by differentiating the optical distances between the reflecting layer 25 and the common electrode 33 for each of the sub pixels 18R, 18G, and 18B. Due to this, it is possible to increase the color purity of the emitted light from each of the sub pixels 18R, 18G, and 18B.

The optical distance described above is determined as a total of the products of the refractive indexes of various types of functional films, which are interposed between the reflecting layer 25 and the common electrode 33 which configure the optical resonator, and the film thicknesses. Accordingly, as a method for differentiating the optical distances described above for each of the sub pixels 18R, 18G, and 18B, there is a method for differentiating the film thicknesses of the pixel electrodes 31R, 31G, and 31B or a method for differentiating the film thickness of the second interlayer insulating film 26 between the reflecting layer 25 and the pixel electrodes 31R, 31G, and 31B. In a case where the organic EL element 30 has a resonant structure as described above, light which is emitted from the organic EL element 30 is light emitted from the common electrode 33 to the sealing layer 34 side which will be described below, and is light in a spectrum which is different from a spectrum of light emitted in the functional layer 32.

Next, the sealing layer 34 which covers a plurality of the organic EL elements 30 is formed on the common electrode 33 in order to prevent moisture, oxygen, or the like from entering. The sealing layer 34 of the present embodiment is formed by a first sealing film (sealing film) 34a, a buffering film 34b, and a second sealing film (sealing film) 34c being laminated in sequence from the common electrode 33 side.

Here, the gas barrier properties of the sealing layer 34 are not particularly limited as long as it is possible to protect the organic EL element 30 from oxygen, water, and the like in the atmosphere; however, it is preferable that the oxygen permeability is 0.01 cc/m$^2$/day or less and it is preferable that the steam permeability is $7\times10^{-3}$ g/m$^2$/day or less, more preferably $5\times10^{-4}$ g/m$^2$/day or less, particularly preferably $5\times10^{-6}$ g/m$^2$/day or less. It is preferable that the light transmittance of the sealing layer 34 is 80% or more with respect to light irradiated from the common electrode 33.

As the first sealing film 34a and the second sealing film 34c, for example, a silicon oxide film (SiO), a silicon nitride film ($Si_XN_Y$), a silicon oxynitride film ($SiO_XN_Y$), and films formed with these as main components, which are inorganic material having light transmittance and excellent gas barrier properties are preferable.

Examples of a method for forming the first sealing film 34a and the second sealing film 34c include a vacuum vapor deposition method, a sputtering method, a chemical vapor deposition (CVD) method, an ion plating method, and the like. The thicker the film thickness of the first sealing film 34a or the second sealing film 34c is, the higher the gas barrier properties that it is possible to realize; however, on the other hand, cracks are easily generated due to film stress which is generated due to expansion or contraction in the film. Accordingly, it is preferable to control each film to be within a film thickness of approximately 200 nm to 1000 nm. In the present embodiment, high gas barrier properties are realized by interposing the buffering film 34b and overlapping the first sealing film 34a and the second sealing film 34c.

It is possible to form the buffering film 34b using, for example, an epoxy-based resin or a coating type inorganic material (silicon oxide and the like) with excellent thermal stability. In addition, when the buffering film 34b is coated and formed by a printing method such as a screen printing, a fixed-quantity discharge method, or the like, it is possible to planarize the surface of the buffering film 34b. In other words, the buffering film 34b is made to function as a planarizing layer which reduces the unevenness of the surface of the first sealing film 34a.

As shown in FIG. 4, an end section of the sealing layer 34 in the terminal region 11t is mainly configured by the first sealing film 34a and the second sealing film 34c and does not have a configuration which interposes the buffering film 34b between the first sealing film 34a and the second sealing film 34c as the display region E1. Since considerable unevenness is generated in the display region E1 due to the structures of the pixel circuit 20, the organic EL element 30, or the like, it is necessary to reduce unevenness by interposing the buffering film 34b. On the other hand, this is because, since the organic EL element 30 or the like is not present in the dummy region E2, it is not particularly necessary to take the unevenness of the base into consideration.

In addition, the end section of the sealing layer 34 described above is easily influenced by moisture or the like since the end section directly comes into contact with the outside. Therefore, it is possible for a configuration which has only the first sealing film 34a and the second sealing film 34c to realize higher gas barrier properties. Furthermore, since it is possible to configure the first sealing film 34a and the second sealing film 34c of the same material, mutual adhesion therebetween is great and it is possible to further increase the gas barrier properties.

As shown in FIG. 3, colored layers 36R, 36G, and 36B which correspond to each color of the sub pixels 18R, 18G, and 18B are formed on the sealing layer 34. Examples of a method for forming the color filter 36 which is configured by the colored layers 36R, 36G, and 36B include a method in which a photosensitive resin layer is formed by coating a photosensitive resin in which a coloring material such as a dye or a pigment which corresponds to each color is dispersed in a solvent and forms the color filter 36 by photographically exposing and developing the photosensitive resin layer using a photolithographic method. The film thicknesses of the colored layers 36R, 36G, and 36B may be the same for each color, or at least one color may be different from the other colors. In any case, the film thickness is set such that an appropriate chromaticity or white balance is obtained when light emitted from the organic EL element 30 passes through each of the colored layers (36R, 36G, and 36B).

The color filter 36 in the present embodiment extends in the Y direction between the colored layers 36R, 36G, and 36B of the different colors, and has an insulating layer 35 with stripes which distinguishes the colored layers 36R, 36G, and 36B of the different colors. The insulating layer 35 is formed with the material of a photosensitive resin which does not include a coloring material. The cross-sectional shape of the insulating layer 35 is not limited to a trapezoidal shape, and the length of a bottom surface of the insulating layer 35, the bottom surface being in contact with the sealing layer 34, is desirably 0.5 µm to 1 µm in the X direction, which is approximately the same as the dimensions between the pixel electrodes 31. The insulating layer 35 is formed over the display region E1 and the dummy region E2. Light emitted from the organic EL element 30 of a sub pixel 20B transmits the colored layer 36B of blue, and is blocked by the colored layer 36G of green and the colored layer 36R of red. In the same manner as above, light emitted from the organic EL element 30 of a sub pixel 20G transmits the colored layer 36G of green, and is blocked by the colored layer 36B of blue and the colored layer 36R of red. Light emitted from the organic EL element 30 of a sub pixel 20R transmits the colored layer 36R of red, and is blocked by the colored layer 36B of blue and the colored layer 36G of green. Therefore, by the position of each of the organic EL elements 30 and the position of each of the colored layers of the color filter 36, the direction of the light extracted from the organic EL apparatus 100 is defined.

Here, the colored layer 36G (the color filter 36) comes up to the display region E1 in FIG. 4; however, without being limited thereto, there may be a configuration where the colored layer 36G covers up to the dummy region E2 (a boundary between the terminal region 11t and the sealing substrate 41). According to this configuration, in a subsequent process which carries out the forming by coating the filler 42, the filler 42 does not come into contact with either the colored layer 36G (the color filter 36) or the second sealing film 34c, the wettabilities of which are different from each other, and it is possible to only coat the surface of the colored layer 36G (the color filter 36). In other words, it is possible to improve the coating properties of the filler 42.

The element substrate 10 and the sealing substrate 41 are arranged to oppose each other by being spaced at intervals and the filler 42 is coated in the intervals, as shown in FIGS. 3 and 4. For a function of the filler 42, it is necessary for the filler 42 to have good wettability and adhesion with respect to the sealing substrate 41 and the element substrate 10 and additionally, to be transparent with respect to light emitted from the organic EL element 30. Therefore, examples of the filler 42 include a resin material such as a urethane-based resin, an acryl-based resin, an epoxy-based resin, and a polyolefin-based resin. The thickness of the filler 42 is, for example, 10 μm to 100 μm.

Terminal Region 11t of Element Substrate 10 and Peripheral Structure Thereof

As shown in FIG. 4, the mounting terminals 101 are formed on the second interlayer insulating film 26 in the same manner as the pixel electrode 31 in the terminal region 11t of the element substrate 10. In addition, the mounting terminals 101 are connected with a wiring layer 103 which is formed on the first interlayer insulating film 24 via a conductive film in a contact hole 26a which is formed in the second interlayer insulating film 26.

The configuration of peripheral circuits such as the pixel circuit 20 on the base material 11, signal wiring which is connected with the pixel circuit 20, the scan line driving circuit 15, and the like is omitted in FIG. 4; however, each of the plurality of the mounting terminals 101 is electrically connected with respect to these circuits or the signal wiring via the wiring layer 103.

The wiring layer 103 is preferably patterned with the reflecting layer 25 using a conductive film which is formed on the first interlayer insulating film 24; however, the wiring layer 103 may be formed of a material which has a different configuration from the reflecting layer 25.

In addition, the mounting terminals 101 are preferably patterned with the pixel electrode 31 using a conductive film which is formed on the second interlayer insulating film 26; however, the mounting terminals 101 may be formed of a material which has a different configuration from the pixel electrode 31. The mounting terminals 101 may be mounted by wire bonding and the like in addition to being connected with the FPC 105 described above (FIG. 2A). Aluminum (Al), indium tin oxide (ITO), or the like may be used for the mounting terminals 101 in consideration of compatibility with the mounting method and durability with respect to dry etching which uses fluorine-based etching gas in a subsequent sealing film etching process.

In any terminal configuration, since the mounting terminals 101 hold an exposed state without interfering with, for example, the sealing layer 34, the filler 42, and the other members on the upper surface of the second interlayer insulating film 26, it is possible to obtain a favorable electrical connection with the outside.

The thickness T of the sealing substrate 41 in the present embodiment is 0.5 mm to 1.5 mm. As shown in FIGS. 2B and 4, when seen from a surface normal direction of the element substrate 10, a distance L1 between the sealing substrate 41 and the mounting terminal 101 is equal to or longer than a thickness dimension of the sealing substrate 41, and thus the relationship of T<L1 is satisfied. In other words, when seen from the surface normal direction of the element substrate 10, the mounting terminal 101 is arranged on one surface of the element substrate 10 while having the distance which is equal to or longer than the thickness dimension of the sealing substrate 41 from the position which overlaps an end section (end section of the mounting terminal 101 side) 41a of the sealing substrate 41.

In addition, a distance L2 between one side 11A of the element substrate 10 where the mounting terminals 101 are arranged and the mounting terminal 101 is equal to or longer than the half of the thickness dimension of the sealing substrate 41 (T/2<L2).

Method for Manufacturing Organic EL Apparatus

Next, with regard to the method for forming the organic EL apparatus of the present embodiment, detailed description will be given of a method for forming the mounting terminals 101 with high connection reliability which is a feature of the invention with reference to FIG. 5 to FIG. 7B.

Figure 5:
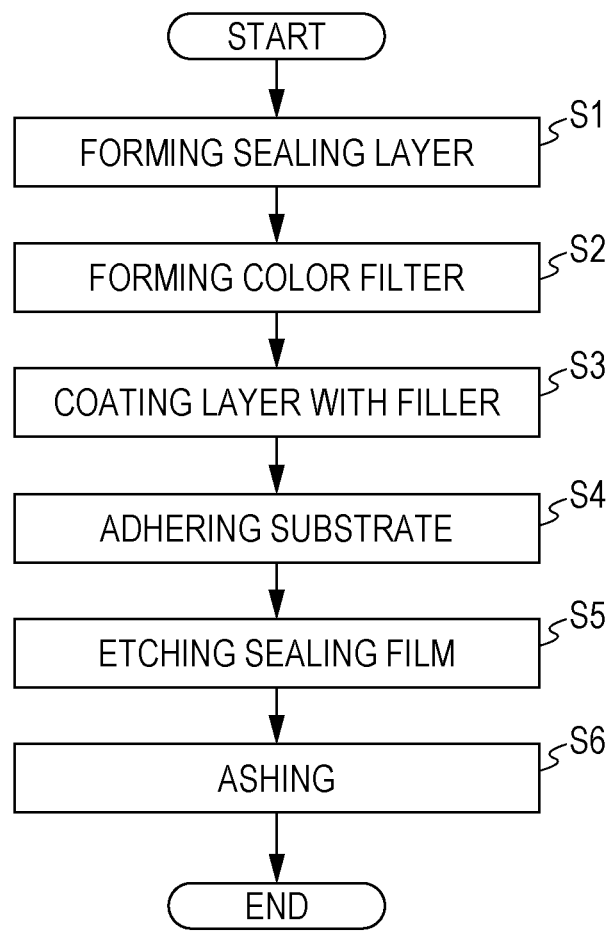
FIG. 5 is a flowchart which shows a method for manufacturing an organic EL apparatus.

FIG. 5 is a flowchart which shows a method for manufacturing the organic EL apparatus 100 and FIGS. 6A to 6C and FIGS. 7A and 7B are schematic cross-sectional diagrams which show a method for manufacturing the organic EL apparatus 100. Here, FIGS. 6A to 6C and FIGS. 7A and 7B are schematic cross-sectional diagrams in the region which corresponds to FIG. 4.

As shown in FIG. 5, a method for manufacturing the organic EL apparatus 100 in the present embodiment includes a sealing layer forming process (step S1), a color filter forming process (step S2), a filler coating process (step S3), a substrate adhering process (step S4), a sealing film etching process (step S5), and an asking process (step S6).

Here, it is possible to adopt a forming technique, a hole filling technique, a planarizing technique, and other related processes known in the art for the method for forming the pixel circuit 20, the reflecting layer 25, the organic EL element 30, the other peripheral circuits, the signal wiring, and the like on the base material 11.

Sealing Layer Forming Process (Step S1)

Figure 6A:
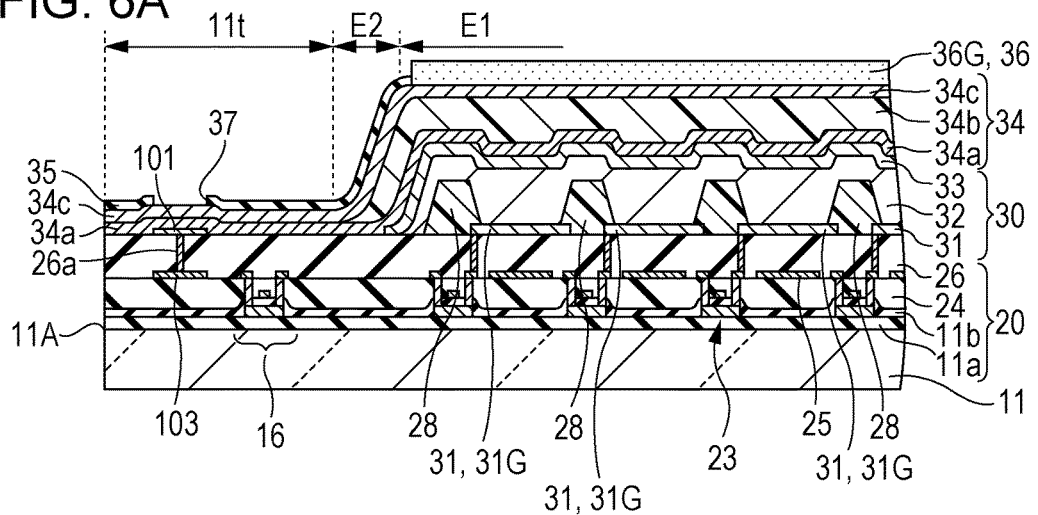
FIGS. 6A to 6C are schematic cross-sectional diagrams which show the method for manufacturing an organic EL apparatus.

As shown in FIG. 6A, firstly, the first sealing film 34a which covers the common electrode 33 and the terminal region 11t (the mounting terminals 101) is formed. Examples of the method for forming the first sealing film 34a include a method for forming a silicon oxide film (SiO), a silicon nitride film ($Si_xN_y$), or a silicon oxynitride film ($SiO_xN_y$) by a vacuum vapor deposition method, a sputtering method, a CVD method, an ion plating method, and the like. It is desirable that the film thickness of the first sealing film 34a is within a range of approximately 200 nm to 1000 nm and in this case, the film thickness is set to 400 nm.

Next, the buffering film 34b which covers the first sealing film 34a is formed. It is desirable that the buffering film 34b is formed so as to be within the dummy region E2 without overlapping a boundary between the terminal region 11t and the sealing substrate 41. As a method for forming the buffering film 34b, for example, the buffering film 34b formed with an epoxy resin is formed by using a solution which includes an epoxy resin having transparency and a solvent for the epoxy resin, coating the solution using a printing method or a fixed-quantity discharge method, and carrying out drying. The film thickness of the buffering film 34b is preferably 1 μm to 5 μm and more preferably 1.5 μm to 2.0 μm. In this case, the film thickness is set to 2 μm.

Here, the buffering film 34b is not limited to being formed using an organic material such as an epoxy resin. For example, by coating a coating type inorganic material using a printing method and drying and sintering the result, a silicon oxide film with a film thickness of approximately 2 μm may be formed as the buffering film 34b.

Subsequently, the second sealing film 34c which covers the buffering film 34b is formed. Examples of the method for forming the second sealing film 34c are the same as for the first sealing film 34a and include a method for forming a silicon oxide film (SiO), a silicon nitride film ($Si_XN_Y$), or a silicon oxynitride film ($SiO_XN_Y$) using a vacuum vapor deposition method, a sputtering method, a CVD method, an ion plating method, or the like. It is desirable that the film thickness of the second sealing film 34c is also within a range of approximately 200 nm to 1000 nm and, in this case, the film thickness is set to 800 nm. Then, the process proceeds to step S2.

Color Filter Forming Process (Step S2)

As shown in FIG. 6A, first, a photosensitive resin layer is formed by coating the entire surface of the base material 11 with a photosensitive resin which does not include a coloring material using a spin coating method. The insulating layer 35 with stripes which extends in the Y direction between the pixels, is formed by photographically exposing and developing the photosensitive resin layer. At this time, an opening section 37 is formed and patterned on the region which overlaps the mounting terminal 101 formed on the base material 11 in plan view.

Next, a photosensitive resin layer which includes a coloring material is formed covering the insulating layer 35 by coating and drying a photosensitive resin which includes, for example, a green coloring material using a spin coating method. Subsequently, the green (G) colored layer 36G is formed by photographically exposing and developing the photosensitive resin layer. In the present embodiment, in order to obtain appropriate optical characteristics, the film thickness of the colored layer 36G is in a range of 1.0 μm to 2.0 μm. In addition, although not shown in the diagram, the colored layers 36R and 36B are formed by coating a photosensitive resin which includes coloring materials of each color in the same manner for red and blue and performing photographic exposure and development thereon. That is, it is necessary to perform the coating to photographic exposure and development processes a number of times according to the number of colors of the color filters to be used.

Subsequently, the process proceeds to step S3.

Filler Coating Process (Step S3)

Figure 6B:
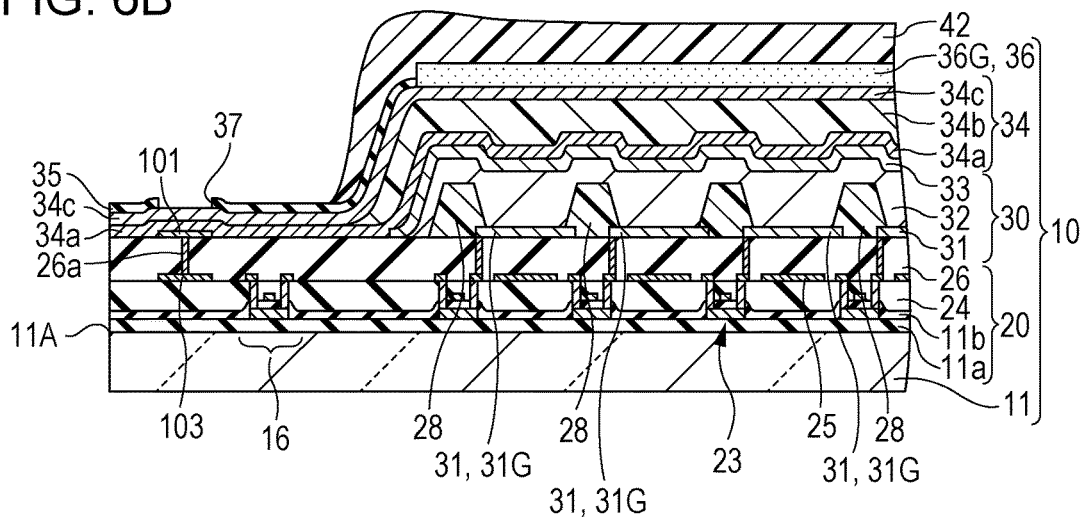
Figure 6C:
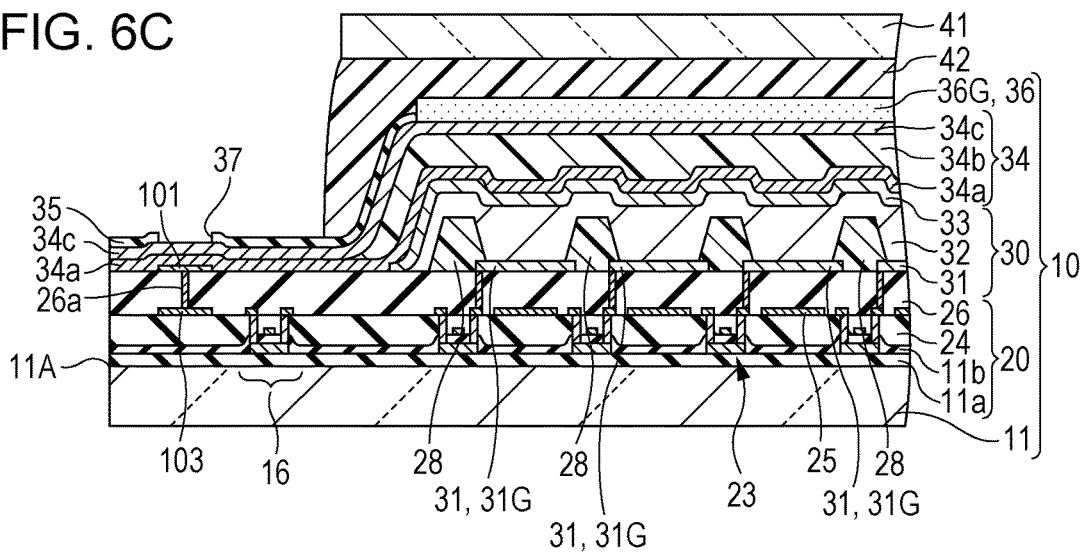

As shown in FIG. 6B, the filler 42 is coated so as to cover the colored layer 36G (36). A thermosetting type epoxy-based resin is used for the filler 42 in consideration of the transmitting properties of light which is emitted from the organic EL element 30 and adhesion between the color filter 36 and the sealing substrate 41. The same effect is obtained even with other resin materials, for example, such as a urethane-based resin, an acryl-based resin, and a polyolefin-based resin. Since the unevenness of a structure, for example, such as the organic EL element 30, is reduced due to the effect of the buffering film 34b, it is possible to coat the filler 42 on a surface of the color filter 36 or the second sealing film 34c with good flowability. Here, the final thickness of the filler 42 is approximately 10 μm to 100 μm. Subsequently, the process proceeds to step S4.

Sealing Substrate Adhering Process (Step S4)

The sealing substrate 41 is arranged (FIG. 6C) at a predetermined position, for example, by vacuum suction or the like, to oppose the base material 11 where the filler 42 is coated in FIG. 6B. Quartz glass is used for the sealing substrate 41 in consideration of the transmitting properties, the handling properties, or the influence of a reaction product due to a subsequent sealing film etching process. The thickness of the sealing substrate 41 is suitably 0.5 mm to 1.2 mm. A substrate of 1.2 mm is used in the present embodiment.

Pressure is applied to the sealing substrate 41 which is arranged opposite at a predetermined pressure and the filler 42 which is interposed between the base material 11 and the sealing substrate 41 and which is still not solidified is evenly spread out in plan view. At this time, there is also a concern that the filler 42 may protrude from an end section of the sealing substrate 41 (a boundary surface with the terminal region 11t), overlap the terminal region 11t, and cover up to the mounting terminals 101. Accordingly, it is preferable to manage the filler 42 such that the filler 42 does not protrude to the terminal region 11t by adjustment of the coating amount of the filler 42, the planar area of the sealing substrate 41, and the degree of pressure. Incidentally, since there is also a possibility that display defects will be caused when there are residual bubbles in the filler 42, it is more preferable to perform the pressurizing work in a vacuum (atmospheric pressure or less) atmosphere.

After the work described above, the filler 42 is solidified at the temperature and time which are conditions for curing the filler 42 and the element substrate 10 and the sealing substrate 41 are adhered. Here, in order to make the filler 42 planarly extend by applying pressure to the sealing substrate 41, it is not particularly desirable to coat the filler 42 on the entire display region E1 in step S3 described above.

Sealing Film Etching Process (Step S5)

Figure 7A:
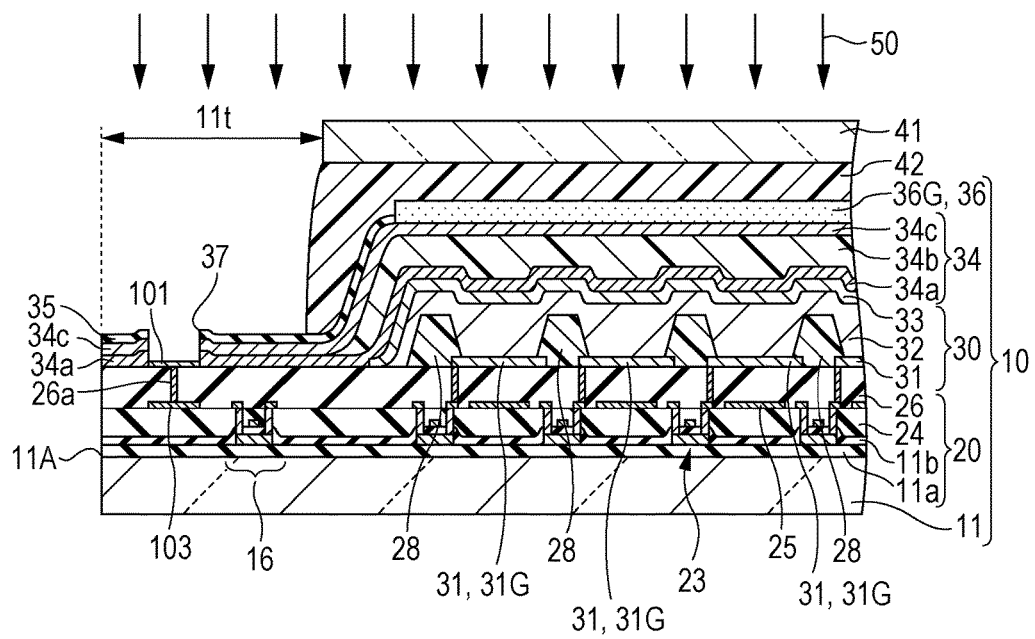
FIGS. 7A to 7B are schematic cross-sectional diagrams which show the method for manufacturing an organic EL apparatus.
Figure 7B:
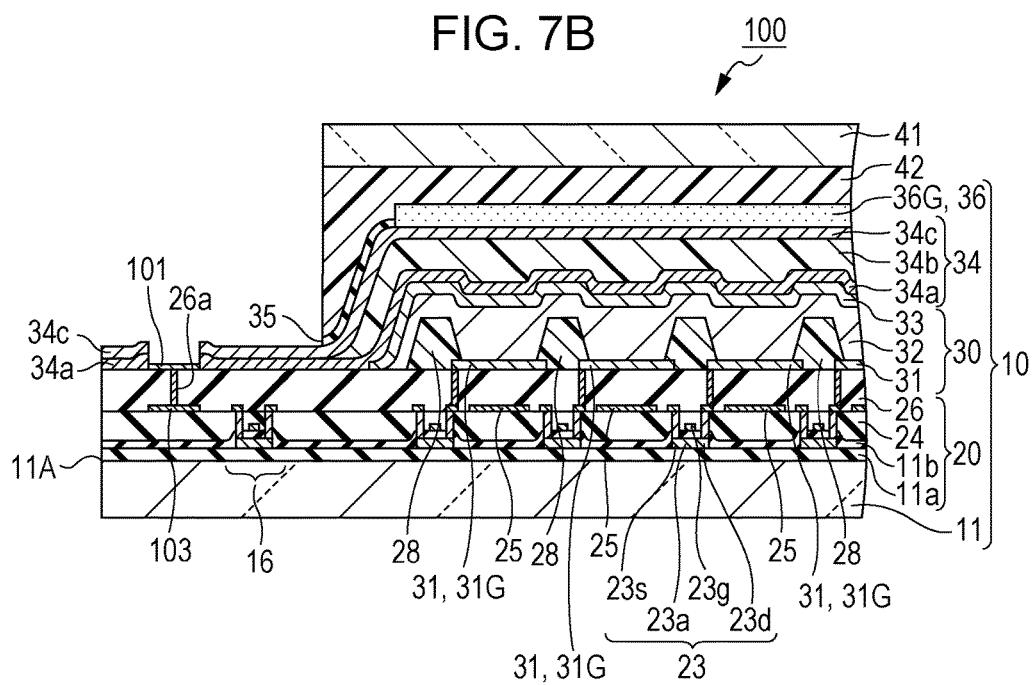

As shown in FIG. 7A, the first sealing film 34a and the second sealing film 34c in the opening section 37 are etched and removed after setting the insulating layer 35 as a mask for etching, and thus the mounting terminal 101 is exposed. For a method of etching, examples may include dry etching or wet etching. At this time, it is possible to protect the organic EL element 30 and the color filter 36 from the damage caused by etching, by the sealing substrate 41.

Here, not only the insulating layer 35, but also the sealing substrate 41 functions as a mask for etching. The first sealing film 34a and the second sealing film 34c on the mounting terminal 101 are etched by setting the sealing substrate 41 and the insulating layer 35 as a mask. For this reason, in the present embodiment, at the same time as the first sealing film 34a and the second sealing film 34c, a part of the insulating layer 35 laminated on the second sealing film 34c is removed by etching.

In this process, the sealing films 34a and 34c which are the etching targets in the opening section 37 of the insulating layer 35, are etched, and the insulating layer 35 which is a photoresist is etched at the same time. In a case of performing the etching process for a slightly longer period in order to reliably expose the surface of the mounting terminal 101, there is a possibility that the insulating layer 35 on the sealing films 34a and 34c in the terminal region 11t, is almost removed. If the insulating layer 35 which is the photosensitive resin is removed completed, the sealing films 34a and 34c which are provided in the region outside the mounting terminal 101, that is, the sealing films 34a and 34c which are supposed to remain without being etched in the terminal region 11t, are etched. Here, in the sealing film etching process, the etching is performed under the condition that some part of the insulating layer 35 remains without being etched. The remaining part of the insulating layer 35 in the terminal region 11t is small, and thus is omitted from the illustration of FIG. 7B which shows a state after the etching process.

Examples of a method for selectively etching the first sealing film 34a and the second sealing film 34c formed with an inorganic film such as a silicon oxide film (SiO), a silicon nitride film ($Si_XN_Y$), a silicon oxynitride film ($SiO_XN_Y$), or the like include dry etching which uses a fluorine-based processing gas such as $CHF_3$ (methane trifluoride), $CF_4$ (carbon tetrafluoride), $NF_3$ (nitrogen trifluoride), and $SF_6$ (sulfur hexafluoride).

The dry etching is performed by applying a high frequency voltage under a predetermined gas flow rate and chamber pressure. By the sealing films (34a and 34c) or the sealing substrate 41 being irradiated with plasma particles (arrows 50 in FIG. 7A) according to the gas type and a volatile substance being generated due to a chemical reaction occurring between the plasma particles and the sealing films (34a and 34c), which are the materials to be irradiated, and the like, the material to be irradiated is removed.

In the terminal region 11t (the mounting terminals 101), the first sealing film 34a and the second sealing film 34c are overlapped. Then, the sealing films (34a and 34c) are any of a silicon oxide film (SiO), a silicon nitride film ($Si_XN_Y$), or a silicon oxynitride film ($SiO_XN_Y$) and have Si or SiO as a main component. Thus, it is possible to remove the first sealing film 34a and the second sealing film 34c as a batch by the same type of etching gas.

In the present embodiment, the film thickness of the sealing films (34a and 34c) is approximately 1200 nm (thickness of the first sealing film 34a: 400 nm+thickness of the second sealing film 34c: 800 nm). On the other hand, the thickness of the sealing substrate 41 is 1.2 mm. Thus, the sealing substrate 41 has a thickness sufficient for the removal of the sealing films (34a and 34c) on the mounting terminal 101 and functions as a mask in a sealing film etching process. The film thickness of the insulating layer 35 is approximately 1000 nm.

In the sealing film etching process, in order perform forming in a predetermined sealing film pattern, predetermined power is applied to make etching gas into plasma, bias power is applied to the element substrate 10, and thus etching is performed.

On the surface of the element substrate 10 and the surface of the sealing substrate 41, because a substrate bias is differently applied with respect to plasma, the vicinity of a high part of the sealing substrate 41 is less likely to be etched.

In the present embodiment, when seen from the surface normal direction of the element substrate 10, the mounting terminal 101 is arranged by being separated from the end section 41a of the sealing substrate 41 by a distance which is equal to or longer than the thickness dimension of the sealing substrate 41. By arranging the mounting terminal 101 being separated from the sealing substrate 41 with the high part thereon and on the region where a sheath in plasma is uniformly formed in the terminal region 11t, it is possible to stably etch the first sealing film 34a and the second sealing film 34c on the mounting terminal 101. According to this, even if the thickness of the sealing substrate 41 is equal to or larger than 1 mm, it is possible to secure a sufficient etching rate with respect to the sealing layer 34 on the mounting terminal 101.

Here, a difference of an etching rate according to the distance between the sealing substrate 41 and the mounting terminal 101 will be described.

Figure 8:
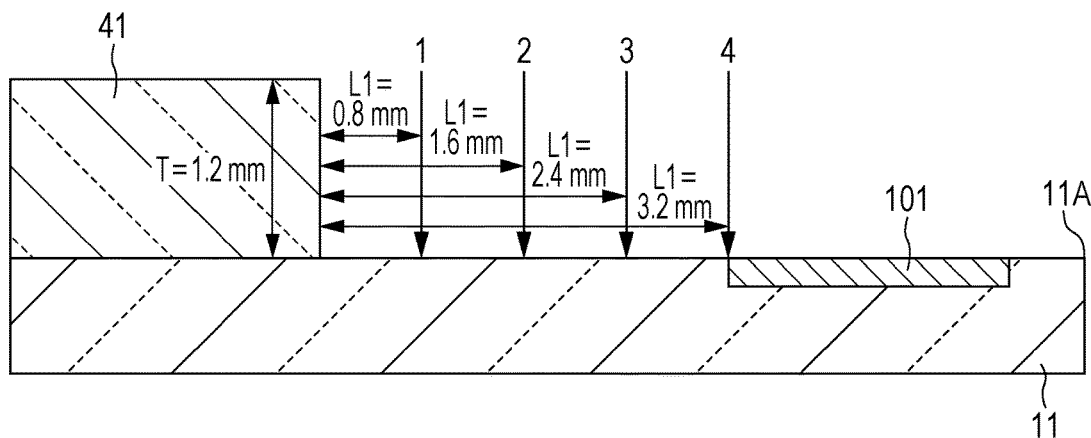
FIG. 8 is a cross-sectional diagram which shows a distance between a sealing substrate and a mounting terminal.

FIG. 8 is a cross-sectional diagram which shows a distance between the sealing substrate and the mounting terminal, and mainly shows the sealing substrate, the element substrate, and the mounting terminal. Other configuration elements are omitted from the description.

Figure 9:
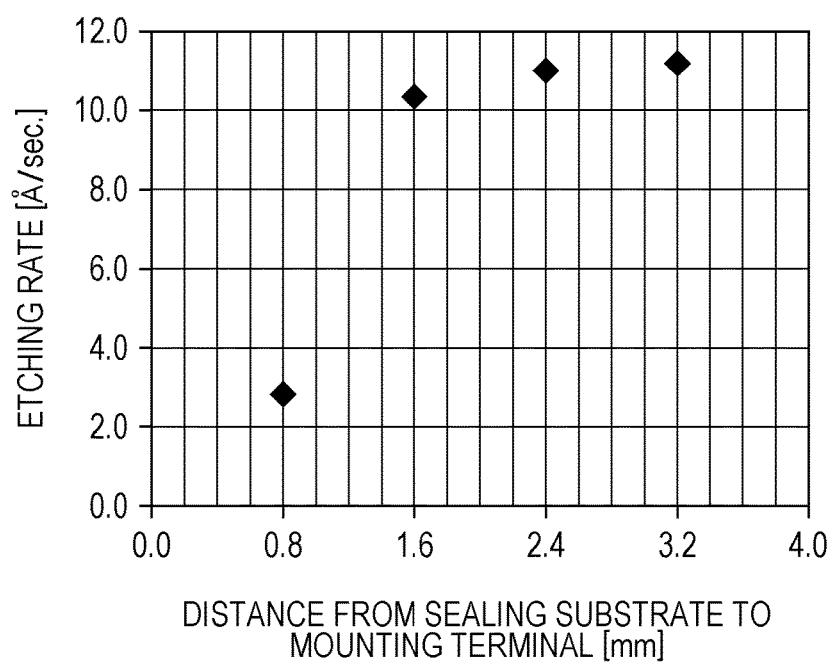
FIG. 9 is a graph which shows a relationship between a distance mm from the sealing substrate to the mounting terminal, and an etching rate A/sec.

FIG. 9 is a graph which shows a relationship between a distance mm from the sealing substrate to the mounting terminal, and an etching rate A/sec. In Table 1, an etching rate according to each distance between the sealing substrate 41 and the mounting terminal 101 is shown. In addition, in Table 2, conditions for the etching process are shown.

TABLE 1

| Distance L1 (mm) | Etching rate (Å/sec) |
| --- | --- |
| 0.8 | 2.80 |
| 1.6 | 10.30 |
| 2.4 | 11.00 |
| 3.2 | 11.20 |

TABLE 2

| | Gas used 1 | | Gas used 2 | | | |
| --- | --- | --- | --- | --- | --- | --- |
| Step | Gas type | Flow rate | Gas type | Flow rate | RF_Power | Pressure |
| Etching | $CF_4$ | 80 sccm | — | — | 200 W | 25 Pa |
| Ashing | $O_2$ | 20 sccm | Ar | 20 sccm | 200 W | 30 Pa |

Conditions for the Etching Process
  Processing gas: $CF_4$ (carbon tetrafluoride)
  Gas flow rate: 80 sccm
  RF power: 200 w
  Chamber internal pressure: 25 Pa As shown in FIGS. 8 and 9, it is understood that as the mounting terminal 101 is separated from the sealing substrate 41, the etching rate with respect to the first sealing film 34a and the second sealing film 34c increases. Specifically, as can be understood from Table 1, a difference between the etching rate with respect to the first sealing film 34a and the second sealing film 34c when the distance L1 between the sealing substrate 41 and the mounting terminal 101 is equal to or longer than a thickness T (1.2 mm) of the sealing substrate 41, and the etching rate when the distance L1 is equal to or shorter than the thickness T, is large. If the distance L1 becomes equal to or longer than the thickness dimension of the sealing substrate 41, the etching rate with respect to the sealing layer 34 increases in each steps. Therefore, it is preferable that a relationship between the thickness T of the sealing substrate 41, and the distance L1 between the sealing substrate 41 and the mounting terminal 101, satisfies T<L1. From the point of view that as the distance L1 increases, the etching rate increase, at least the relationship of T<L may be satisfied.

Aluminum (Al) or indium tin oxide (ITO) is used for the mounting terminals 101 as described above. Thus, after removing the sealing films (34a and 34c) in the opening section 37, the mounting terminals 101 themselves become a favorable etching stop material and the mounting terminals 101 are protected with respect to the sealing film etching process.

Here, there is also a possibility that the etching rate will not be unconditionally determined just by the material due to the difference in the heights at which the mounting terminals 101 and the sealing substrate 41 are positioned.

Ashing Process (Step S6)

Next, after the sealing film etching process, an organic material which is the etching residue on the element substrate 10 including the surface of the mounting terminal 101, or the like is removed. By performing the ashing process, it is possible to remove the residue on the insulating layer 35 which is an organic resin, and to realize a surface state of the mounting terminals 101 which is already favorable for connection with the FPC 105. Conditions for ashing are shown in Table 2.

Conditions for the Ashing Process
Processing gas: $O_2$ (oxygen), Ar (argon)
Gas flow rate: 20 sccm
RF power: 200 w
Chamber internal pressure: 30 Pa After exposing and surface treating the terminal region 11t (the mounting terminals 101) of the element substrate 10 in the process described above (FIG. 7B), the FPC 105 is mounted in the mounting terminals 101 as shown in FIG. 2A and the organic EL apparatus 100 is completed.

As described above, according to the first embodiment described above, the following effects are obtained.

When etching the first sealing film 34a and the second sealing film 34c which cover the mounting terminal 101, the sealing substrate 41 is used as an etching mask. In the present embodiment, by setting the position of the mounting terminal 101 on the element substrate 10 being separated from the sealing substrate 41 by the predetermined distance (thickness dimension of the sealing substrate 41) or longer, it is possible to stably etch the first sealing film 34a and the second sealing film 34c present in the terminal region 11t, and to reliably expose the surface of the mounting terminal 101 in the sealing film etching process. As described above, even if the thickness of the sealing substrate 41 used as the mask for etching is larger than 1 mm, it is possible to stably perform the sealing film etching process.

According to this, it is possible to improve electrical connection reliability between the mounting terminals 101 and an output terminal on the FPC 105 side, and to provide the organic EL apparatus 100 with excellent display quality.

In the present embodiment, because etching is performed by using the sealing substrate 41 as a mask, masking is unnecessary, and thus the manufacturing process is simplified and further high productivity is obtained.

In addition, for the method for manufacturing the organic EL apparatus 100 described above, description was given with one organic EL apparatus 100 as a unit; however, in practice, simultaneously forming a plurality of organic EL panels (in a state before the FPC 105 is mounted) in the organic EL apparatus 100 may be considered. Below, description will be given of an example which uses a mother substrate.

Figure 10:
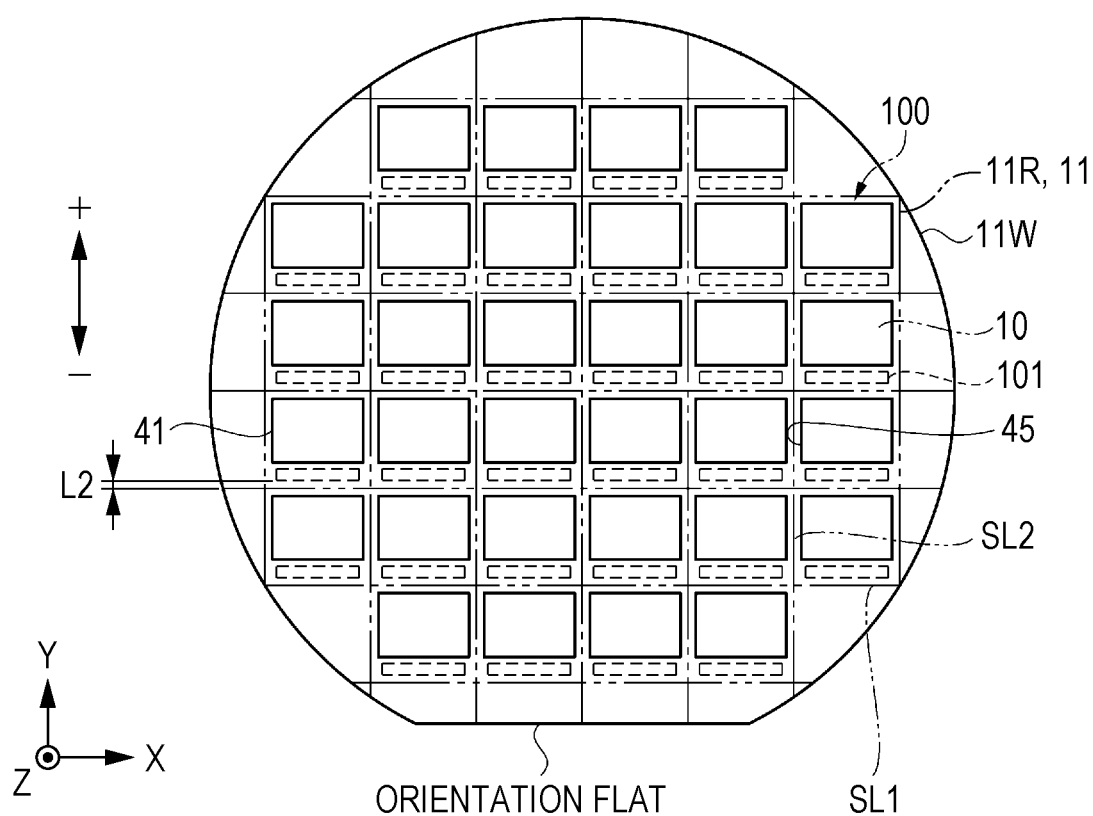
FIG. 10 is a schematic planar diagram which shows a mother substrate where a plurality of element substrates are placed (laid out) and sealing substrates are respectively arranged.

FIG. 10 is a schematic planar diagram which shows a mother substrate where the plurality of element substrates 10 are placed (laid out) and sealing substrates 41 are respectively arranged.

As shown in FIG. 10, a mother substrate 11W is, for example, a quartz glass substrate in a wafer form and, in terms of size, for example, has a diameter of 200 mm to 300 mm and an orientation flat which represents a plane orientation is provided by cutting out a part of the periphery. With the orientation flat as a reference, an X direction, a Y direction, and a Z direction which is orthogonal thereto are set. Scribe lines used when finally carrying out fragmenting into the organic EL apparatuses 100 are denoted by SL. Here, since the organic EL apparatus 100 of the present embodiment is a top emission type, as described above, it is possible to use not only a transparent quartz glass substrate, but also, for example, an opaque silicon substrate for the base material 11 of the element substrate 10. In other words, it is also possible to use a silicon wafer as the mother substrate 11W.

In the mother substrate 11W, a plurality the element substrate forming region 11R are set, and the element substrate 10 is formed in a state where a plurality of the base materials 11 are placed on a surface in a matrix form. Here, in the mother substrate 11W, when seen from a surface normal direction thereof, the display regions E1 of each of the element substrate forming regions 11R are adjacent with each other in the X direction, the terminal regions 11t of each of the element substrate forming regions 11R are present so as be adjacent with each other in the X direction, and the display regions E1 and the terminal region 11t of each of the element substrate forming regions 11R are alternatively present in the Y direction.

In this case, in the process of forming the mounting terminals 101 in each of the plurality of element substrate forming regions 11R, the mounting terminal 101 is formed such that the distance L1 between a scribe line SL1 between the mounting terminal 101 in one element substrate forming region 11R, and the other element substrate forming region 11R, that is, the scribe line SL1 extending in the X direction, becomes equal to or longer than the half of the thickness dimension of the sealing substrate 41, both the element substrate forming regions being adjacent to each other in the Y direction.

With regard to the element substrate 10 where a plurality of the organic EL elements 30 are formed, the sealing layer 34 is formed in the sealing layer forming process (step S1).

Subsequently, the insulating layer 35 and the color filters 36 (the colored layers 36R, 36G, and 36B) are formed in the color filter forming process of step S2. Subsequently, in the filler coating process (step S3), the filler 42 is coated with respect to each of the element substrates 10 in a completed state.

In the substrate adhering process (step S4), the sealing substrate 41 is overlapped with the element substrate 10 while being aligned therewith. The sealing substrate 41 is arranged so as not to cover the terminal region 11t (the mounting terminals 101) (FIG. 10). Then, the element substrate 10 and the sealing substrate 41 are adhered by heating and curing the thermosetting type filler 42.

In the sealing film etching process (step S5), after setting the sealing substrate 41 (insulating layer 35) as a mask, the sealing films (34a and 34c) which cover the upper side of the mounting terminal 101 are partially removed by etching. Also, in this case, at the same time of etching the sealing films (34a and 34c), the insulating layer 35 which covers the sealing films (34a and 34c) and is on the terminal region 11t, is also etched.

As described above, because the distance L2 between the scribe line SL1 between the element substrate forming regions 11R adjacent to each other in the vertical direction (Y direction), and the mounting terminal 101 of the element substrate forming region 11R which is present on the + side of the Y direction than the scribe line SL1 (upper side in the drawing), is separated by the distance which is equal to or longer than the half of the thickness dimension of the sealing substrate 41, the sealing films (34a and 34c) which is present on the mounting terminal 101 in the element substrate forming region 11R, can be sufficiently removed by etching.

In addition, it is desirable to pattern-form the insulating layer 35 which is a mask for etching in advance such that not only the sealing films (34a and 34c) covering the mounting terminal 101, but also the sealing films (34a and 34c) on the scribe line SL1 and the scribe line SL2, is removed.

After that, by cutting the mother substrate 11W along the virtual scribe lines SL between the adjacent element substrates 10, the individual fragmented organic EL apparatuses 100 are extracted. Since the sealing films (34a and 34c) on the scribe lines SL1 and SL2 are removed in the sealing film etching process, when cutting the mother substrate 11W, for example, the sealing films (34a and 34c) are not often wound due to the rotation of the cutting blade. Thus, since it is possible to reduce the generation of cracks or peeling in the sealing films (34a and 34c) on an outer edge side of the element substrate 10, it is possible to maintain favorable gas barrier properties. Incidentally, examples of a cutting method include a line inserting scribe method which uses a cemented carbide tip or a diamond tip, or a dicing method which uses a diamond blade.

Here, a method for manufacturing the organic EL apparatus 100 which uses the mother substrate 11W is not limited only to the element substrate 10 side. That is, application is also possible to a method in which the mother substrate 11W on which the element substrate 10 is placed and a mother substrate for sealing on which the sealing substrate 41 is placed are adhered and cutting is carried out thereon.

As described above, even in a case of manufacturing the plurality of organic EL apparatuses 100 at the same time by using the mother substrate, by providing the mounting terminal 101 on the position separated from the scribe line SL1 (corresponding to the one side 11A of the element substrate 10 after being completed) in the element substrate forming region 11R by the distance which is equal to or longer than the half of the thickness dimension of the sealing substrate 41, it is possible to stably perform etching of the sealing layer 34 on the mounting terminal 101 in each of the element substrate forming regions 11R. According to this, it is possible to reliably expose the surface of the mounting terminal 101.

Second Embodiment

Next, an organic EL apparatus according to the second embodiment of the invention will be described.

A basic configuration of an electro-optical apparatus in the present embodiment described below, is substantially similar to the first embodiment, however, the range of forming the cathode is different. Therefore, in the description below, the detailed description will be made on the difference from the first embodiment, and the description for the same parts is omitted. In addition, for the configuration elements same as FIGS. 1 to 4 will be given the same reference numerals in each drawing used for the description.

Figure 11:
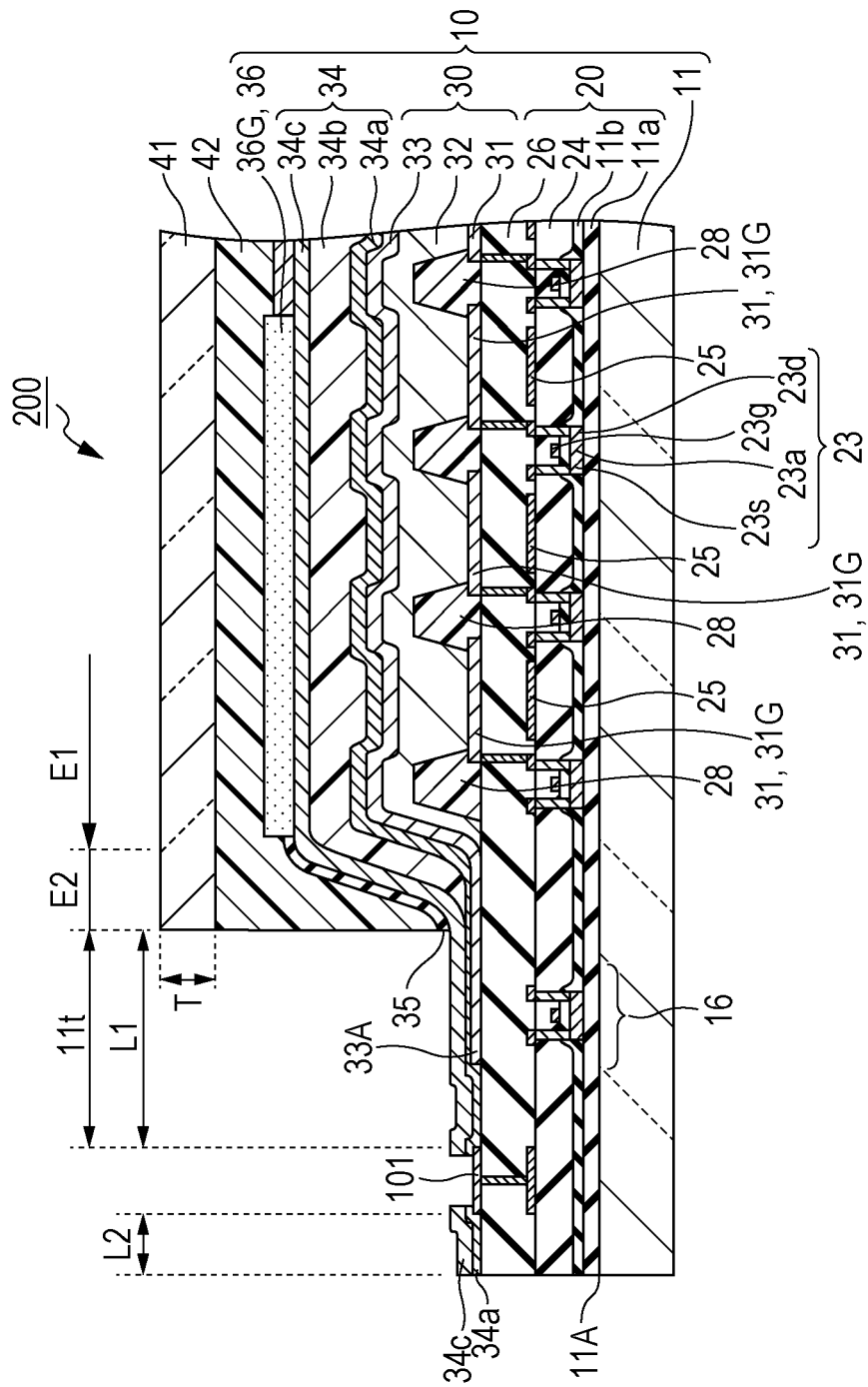
FIG. 11 is a schematic cross-sectional diagram which shows a configuration of an organic EL apparatus according to a second embodiment.

FIG. 11 is a schematic cross-sectional diagram which shows a configuration of an organic EL apparatus according to a second embodiment.

As shown in FIG. 11, in an organic EL apparatus (electro-optical apparatus) 200 in the present embodiment, the common electrode 33 which functions as the cathode of the organic EL element 30, is formed to cover the upper side of the data line driving circuit 16. The common electrode 33 may be formed in the range of covering the entirety of the data line driving circuit 16, or formed to cover a part of the data line driving circuit 16, when seen from the surface normal direction of the element substrate 10. Then, the common electrode 33 is covered by the sealing layer 34. That is, in the present embodiment, a part of the common electrode 33 is not covered by the sealing substrate 41, and an end section 33A of the common electrode 33 is in a state of being exposed to the outside air via the sealing layer 34. According to the configuration as above, the region between the sealing substrate 41 and the mounting terminal 101 can be effectively utilized for the arrangement of a driving circuit such as the data line driving circuit 16.

According to the configuration of the present embodiment, by exposing the part of the common electrode 33 in advance without sealing the electrode by the sealing substrate 41, even in a case where consumed power of the data line driving circuit 16 increases and an amount of heat increases, it is possible to dissipate the heat via the end section 33A of the common electrode 33. The forming range of the common electrode 33 may be broadened so as to cover another control circuits in addition to the data line driving circuit 16. Because heat generated in an integrated circuit can be efficiently dissipated, it is possible to suppress increase in the temperature of the integrated circuit, and to operate the organic EL apparatus at an appropriate temperature. In addition, it is possible to prevent strain or the like in the configuration from occurring by the heat. According to this, the region between the sealing substrate 41 and the mounting terminal 101 can be effectively utilized for dissipating the heat.

In a case of manufacturing the organic EL apparatus 200 of the present embodiment, the common electrode (cathode) 33 is formed to cover the upper side of the data line driving circuit 16 which is provided in the terminal region 11t in the process of forming the organic EL element 30. In addition, the insulating layer 35 and the sealing films (34a and 34c) are etched to expose the end section 33A of the common electrode 33 which is not covered by the sealing substrate 41 in the process of arranging the sealing substrate 41 on the element substrate 10.

Third Embodiment

Next, description will be given of an electronic device according to the embodiment of the invention.

Figure 12:
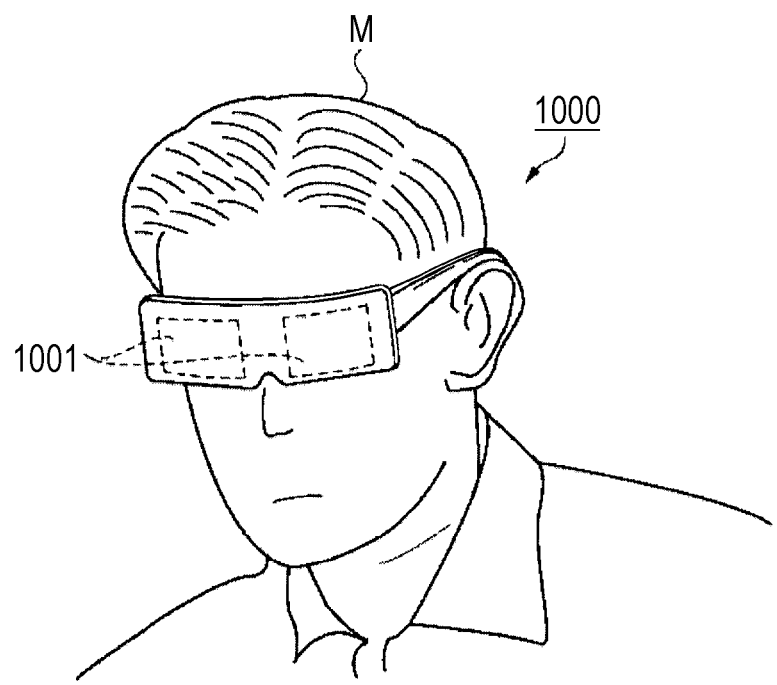
FIG. 12 is a schematic diagram which shows a head mounted display as an electronic device.

FIG. 12 is a schematic diagram which shows a head mounted display (HMD) as an electronic device.

As shown in FIG. 12, a head mounted display (electronic device) 1000 as an electronic device of the present embodiment has two display sections 1001 which are provided corresponding to left and right eyes. An observer M is able to view characters, images, and the like which are displayed on the display sections 1001 by wearing the head mounted display 1000 on the head as glasses. For example, when images taking parallax into consideration are displayed on the left and right display sections 1001, it is also possible to enjoy viewing a three-dimensional movie.

The organic EL apparatus 100 of the first embodiment described above (alternatively, the organic EL apparatus 200 of the second embodiment described above) is mounted on the display sections 1001. Accordingly, since the organic EL apparatus 100 has excellent display quality and high productivity, it is possible to provide the head mounted display 1000 which is excellent in cost performance, small, and light.

The head mounted display 1000 is not limited to having two display sections 1001 and may have a configuration which is provided with one display section 1001 which corresponds to either left or right.

Here, an electronic device where the organic EL apparatus 100 described above or the organic EL apparatus 200 described above is mounted is not limited to the head mounted display 1000. Examples thereof include an electronic device which has a display section such as a personal computer, a portable information terminal, a navigator, a viewer, and a head up display.

As described above, the preferable embodiments of the invention was described while referring to the attached drawings, and it is needless to say that the invention is not limited by the examples. According to the skilled in the art, it is clear that various changes and modifications in the range of the technical idea described in the claims, can be made, and are also included in the technical range of the invention. Configurations of each embodiment may be appropriately combined.

MODIFIED EXAMPLES

For example, in the first and the second embodiments described above, description was given of the organic EL apparatuses 100 and 200 which use the color filter 36 for expressing colors of red (R), green (G), and blue (B); however, the invention is not limited thereto. For example, it is possible to apply the invention to an organic EL apparatus which respectively has a RGB coloring method in which the organic EL element 30 which emits light of three primary colors (R, G, and B) is used, a color conversion method in which emitted light of red (R) and green (G) is obtained through a color conversion layer of a fluorescent body from blue (B) emitted light, and other various types of methods for expressing color.

The entire disclosure of Japanese Patent Application No. 2016-026212, filed Feb. 15, 2016 is expressly incorporated by reference herein.

What is claimed is:

1. An electro-optical apparatus comprising:
an element substrate which includes a display region in which a plurality of light emitting elements are arranged in a matrix form, and a terminal region in which mounting terminals are arranged outside the display region;
a sealing film which seals the plurality of light emitting elements; and
a sealing substrate which is arranged on the element substrate via the sealing film,
wherein a distance between the sealing substrate and the mounting terminal is equal to or longer than a thickness dimension of the sealing substrate when seen from a surface normal direction of the element substrate.

2. The electro-optical apparatus according to claim 1, wherein a distance between one side of the element substrate where the mounting terminals are arranged and the mounting terminal is equal to or longer than the half of the thickness dimension of the sealing substrate.

3. An electronic device comprising the electro-optical apparatus according to claim 2.

4. The electro-optical apparatus according to claim 1, wherein the light emitting element includes an anode, a cathode, and a light emitting layer which is interposed between the anode and the cathode,
the cathode covers a data line driving circuit provided in the terminal region, and
the sealing substrate covers a part of the cathode.

5. An electronic device comprising the electro-optical apparatus according to claim 4.

6. An electronic device comprising the electro-optical apparatus according to claim 1.

7. The electro-optical apparatus according to claim 1, further comprising
a filler which is arranged between the sealing film and the sealing substrate, wherein the filler does not protrude from the sealing substrate toward the terminal region.

8. The electro-optical apparatus according to claim 1, further comprising
a filler which is arranged between the sealing film and the sealing substrate, wherein a distance between the filler and the mounting terminal is equal to the distance between the sealing substrate and the mounting terminal.

* * * * *